United States Patent
Jha et al.

(10) Patent No.: US 9,319,047 B2
(45) Date of Patent: Apr. 19, 2016

(54) COMPUTATION OF BOOLEAN FORMULAS USING SNEAK PATHS IN CROSSBAR COMPUTING

(71) Applicant: UNIVERSITY OF CENTRAL FLORIDA RESEARCH FOUNDATION, INC., Orlando, FL (US)

(72) Inventors: Sumit Kumar Jha, Oviedo, FL (US); Dilia E. Rodriguez, Fayetteville, NY (US); Joseph E. Van Nostrand, Gloversville, NY (US); Alvaro Velasquez, West Palm Beach, FL (US)

(73) Assignee: UNIVERSITY OF CENTRAL FLORIDA RESEARCH FOUNDATION, INC., Orlando, FL (US)

( * ) Notice: Subject to any disclaimer, the term of this patent is extended or adjusted under 35 U.S.C. 154(b) by 0 days.

(21) Appl. No.: 14/573,677

(22) Filed: Dec. 17, 2014

(65) Prior Publication Data

US 2015/0171868 A1   Jun. 18, 2015

Related U.S. Application Data

(60) Provisional application No. 61/917,430, filed on Dec. 18, 2013.

(51) Int. Cl.
| | |
|---|---|
| *H03K 19/0175* | (2006.01) |
| *H03K 19/08* | (2006.01) |
| *H03K 19/173* | (2006.01) |

(52) U.S. Cl.
CPC ........ *H03K 19/017581* (2013.01); *H03K 19/08* (2013.01)

(58) Field of Classification Search
None
See application file for complete search history.

(56) References Cited

U.S. PATENT DOCUMENTS

| | | | |
|---|---|---|---|
| 8,680,906 B1* | 3/2014 | McDonald et al. | 327/164 |
| 2013/0334485 A1* | 12/2013 | Yang et al. | 257/2 |
| 2015/0170025 A1* | 6/2015 | Wu et al. | |

\* cited by examiner

*Primary Examiner* — Jany Richardson
(74) *Attorney, Agent, or Firm* — Preti Flaherty Beliveau & Pachios LLP

(57) ABSTRACT

Memristor-based nano-crossbar computing is a revolutionary computing paradigm that does away with the traditional Von Neumann architectural separation of memory and computation units. The computation of Boolean formulas using memristor circuits has been a subject of several recent investigations. Crossbar computing, in general, has also been a topic of active interest, but sneak paths have posed a hurdle in the design of pervasive general-purpose crossbar computing paradigms. Various embodiments are disclosed which demonstrate that sneak paths in nano-crossbar computing can be exploited to design a Boolean-formula evaluation strategy. Such nano-crossbar designs are also an effective approach for synthesizing high performance customized arithmetic and logic circuits.

20 Claims, 10 Drawing Sheets

FIG. 4

COMPUTATION OF BOOLEAN FORMULAS USING SNEAK PATHS IN CROSSBAR COMPUTING

STATEMENT REGARDING FEDERALLY SPONSORED RESEARCH OR DEVELOPMENT

This invention was made with government support under CA0116UCF2013 awarded by the United States Air Force Research Laboratory. The government has certain rights in the invention.

TECHNICAL FIELD

Various embodiments relate generally to crossbar computing systems, methods, and devices, and more specifically, relate to methods that organize devices into computing systems that use sneak paths for the computation of Boolean formulas.

BACKGROUND

This section is intended to provide a background or context. The description may include concepts that may be pursued, but have not necessarily been previously conceived or pursued. Unless indicated otherwise, what is described in this section is not deemed prior art to the description and claims, and is not admitted to be prior art by inclusion in this section.

In 1971, Leon Chua postulated the existence of a new circuit element. The three basic two-terminal circuit elements then known connect pairs of the four circuit variables: current, i; voltage, v; charge, q; and magnetic flux, $\phi$. Five relationships combining these variables were known: (i) the definition of current and the definition of voltage from the induction law of Faraday, and (ii) the three axiomatic definitions of the known circuit elements. Chart 100 of FIG. 1 shows the relations between different elements and physical properties of circuits. Chua argued completeness required a sixth relationship 110, which would define the missing circuit element. Chua called it 'memristor', a contraction of memory and resistor, for its behavior was somewhat like that of a nonlinear resistor with memory.

Not until 2008 was it physically realized by Stanley Williams and his team at HP Labs (see further: Dmitri B Strukov, Gregory S Snider, Duncan R Stewart, and R Stanley Williams. The missing memristor found. Nature, 453(7191):80-83, 2008). Since then, much research has sought to exploit its properties, from a quest for memristive memories, to memristive devices for neuromorphic computing, to computational logic that uses memristors as logic gates.

The evaluation of Boolean formulas, which has garnered some recent attention, is an enabling technology for synthesizing high-performance, low-power arithmetic and logic circuits.

There is much literature on memristive evaluation of Boolean formulas. Some representative work in this area includes Julien Borghetti, Gregory S Snider, Philip J Kuekes, J Joshua Yang, Duncan R Stewart, and R Stanley Williams 'Memristive' switches enable 'stateful' logic operations via material implication, Nature, 464(7290):873-876, 2010. Borghetti, et al. use two memristors to compute material implication, a fundamental operation in Boolean logic. They leverage this design to synthesize a universal NAND gate using three memristors and three time steps, one initialization step and two implication steps. Another article, Ella Gale, Ben de Lacy Costello, and Andrew Adamatzky. Boolean logic gates from a single memristor via low-level sequential logic. In Unconventional Computation and Natural Computation, pages 79-89, Springer, 2013, describes a single memristor, through which two pulses pass sequentially, with the second being sent before the current spike generated by the first stabilizes. The logical value true is obtained when the current spike goes past a threshold. These designs have two fundamental problems. First, they use a few memristors interacting with other non-memristive circuit elements. It is difficult to put such a heterogeneous mixture of circuit elements on the same hybrid chip. Second, they rely on a sequence of correctly timed inputs, requiring a global clock. Such synchronous extreme-scale circuits are notoriously difficult to design.

For purposes of fabrication, rather than using a few individual memristors, it is more natural to organize sets of them into crossbar networks. However, if the design or application requires that memristors be addressed individually, then the sneak-path problem arises: current flows through unknown paths in parallel to the memristor of interest, which prevents correct detection of its resistance or the flow of current through it. Much research is being devoted to overcoming this problem. The previously proposed solutions often unavoidably increase the complexity of the fabrication process.

BRIEF SUMMARY

The below summary is merely representative and non-limiting.

The above problems are overcome, and other advantages may be realized, by the use of the embodiments.

In a first aspect, an embodiment provides a memristor-based crossbar for evaluating Boolean formulas. The memristor-based crossbar includes a plurality of nanowires, having an input nanowire and an output nanowire, and a plurality of memristors.

In an additional aspect, an embodiment provides a plurality of memristors that serve as switches that in closed positions resist the flow of current. The plurality of memristors is configured to encode a Boolean formula.

In a further aspect, an embodiment provides a method for encoding a given Boolean formula using the plurality of memristors. The method includes, for each memristor in the plurality of memristors, determining an associated state for the memristor, either as a closed switch or as an open switch. The states of the plurality of memristors are configured such that a memristor-based crossbar that includes the plurality of memristors in these states provides at least one sneak path allowing current to flow from the input nanowire to the output nanowire when the Boolean formula is logically true.

BRIEF DESCRIPTION OF THE SEVERAL VIEWS OF THE DRAWINGS

Aspects of the described embodiments are more evident in the following description, when read in conjunction with the attached Figures.

FIG. 4 is a graphical representation of operation of multiple memristors on various nanowire flows.

DETAILED DESCRIPTION

This patent application claims priority to U.S. Provisional Patent Application No.: 61/917,430, filed Dec. 18, 2013, the disclosure of which is incorporated by reference herein in its entirety.

The evaluation of Boolean formulas forms the base of much of computing, including logical and arithmetic calculations. Various embodiments provide an efficient and low-energy method that exploits asynchronous memristor-based crossbars circuits that use sneak paths as a first-class design primitive.

2. Crossbar Computing 2.1 Memristors

In 1971 Chua stipulated the memristor, which furnished the missing functional relation 110 among the circuit variables, relating magnetic flux $\phi$ and charge q: $d\phi = M\, dq$. Since $d\phi = v\, dt$ and $dq = i\, dt$, the function M defining the memristor may be expressed equivalently as $v = M\, i$, which when linear is identical with resistance R, but when nonlinear and a function of the state of the memristor is a new property. It was not until 2008 that Stanley Williams and his team at HP Labs team fabricated what they discovered to be a memristor. The discovery was possible when they realized that the current/voltage curve of their device showed the characteristic hysteretic loop of memristors.

Figure 11:
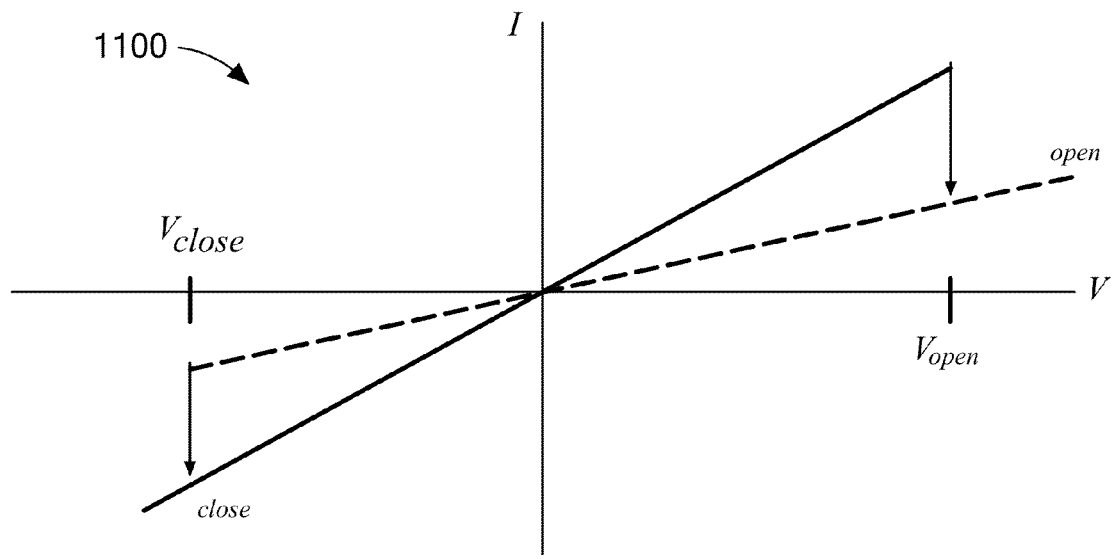
FIG. 11 shows an idealized current/voltage curve for a memristor.

FIG. 11 shows an idealized current/voltage curve 1100 for a memristor. Low- and high-resistance states may be used to represent Boolean values 1 (or true) and 0 (or false), respectively. If the voltage applied to a memristor in a low-resistance state exceeds $V_{open}$, the memristor toggles from the logical state true to the logical state false: the memristor switch closes. If the voltage applied to a memristor in a high-resistance state is less than $V_{close}$, the memristor toggles from state false to state true: the memristor switch opens. For voltages in the range of $[V_{close}, V_{open}]$ the memristor is essentially non-volatile.

2.2 Crossbars

Figure 1:
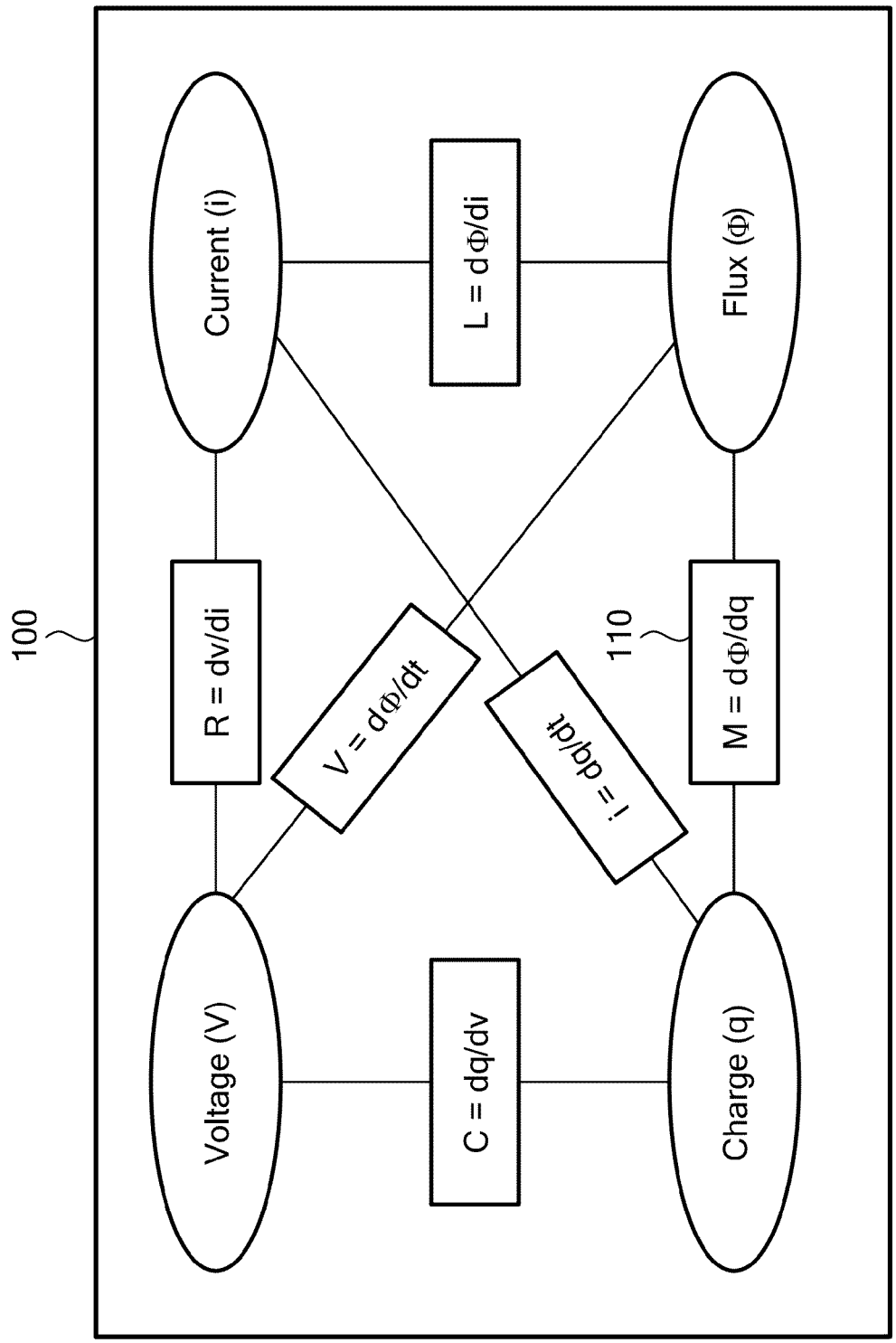
FIG. 1 shows relations between different elements and physical properties of circuits.
Figure 2:
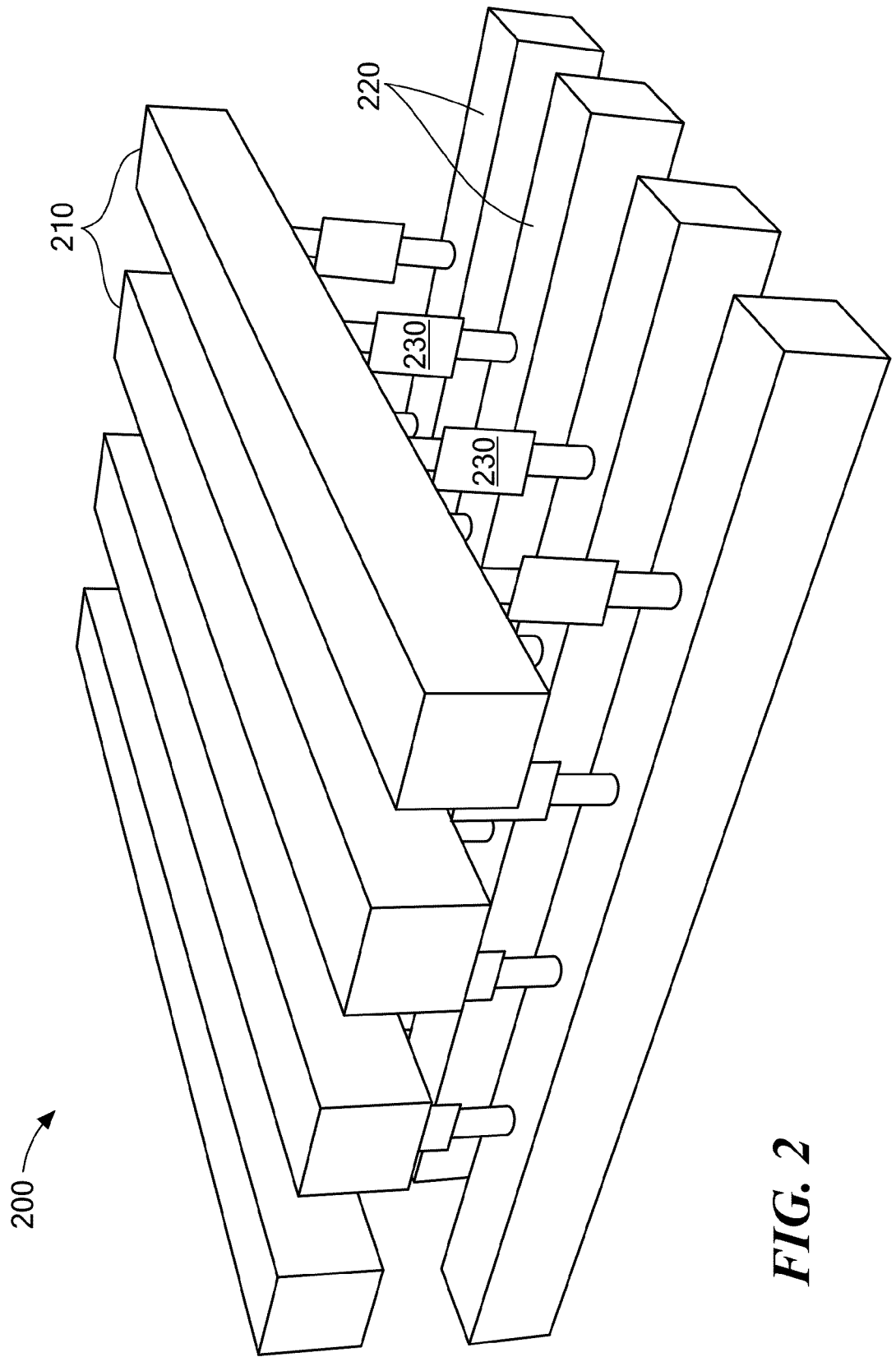
FIG. 2 illustrates a crossbar lattice with a plurality of memristors.

It is natural to organize sets of memristors into crossbar networks 200: a top set of parallel nanowire electrodes 210, the row-nanowires, and a bottom set of parallel nanowire electrodes 220 perpendicular to the top one, the column-nanowires, and a memristor 230 at each crosspoint, see FIG. 2.

2.3 Sneak Paths: A Problem

Figure 12:
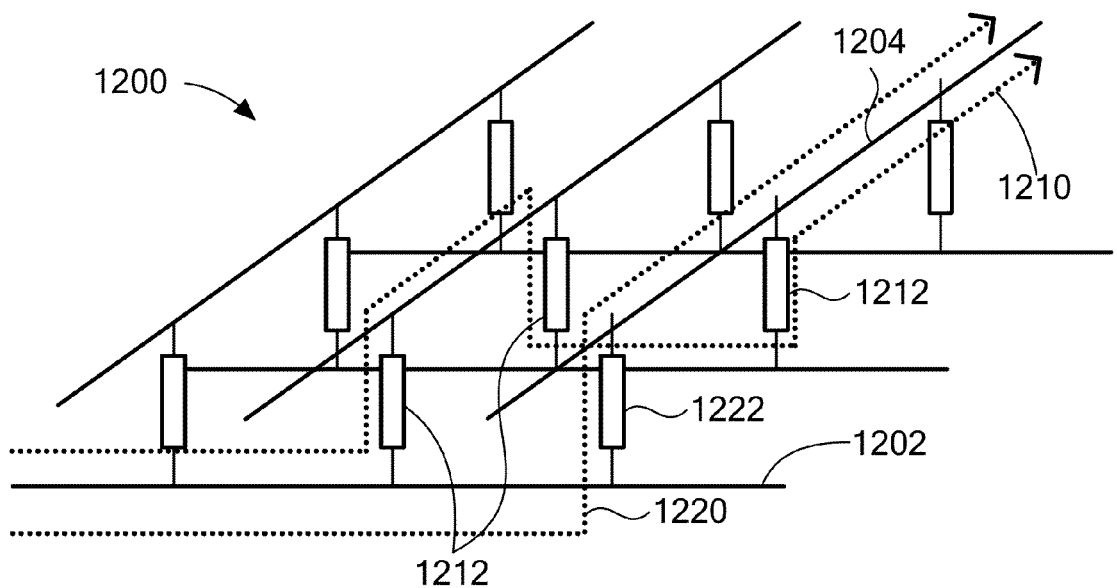
FIG. 12 shows an example of current flow in a crossbar.

Ideally, to determine the state of a memristor at the intersection of a row- and a column-nanowire in a crossbar, current would be passed through that memristor, from which the state (resistance) of the memristor would be determined. FIG. 12 shows a crossbar in which the memristor 1222 at the intersection of row 1 and column 3 nanowires is in its high-resistance state. The ideal situation is that current from the input-nanowire 1202 on row 1 would flow along path 1220 through the memristor 1222, and because of its high-resistance state only a small amount of current would be detected at the output-nanowire 1204 in column 3. In a crossbar, however, there are alternative paths through which current may flow. If a memristor 1222 is in a high-resistance state, alternative paths are determined by usually unknown series of memristors 1212 in low-resistance states, which are called sneak paths. FIG. 12 shows one such path 1210 determined by three memristors 1212 in their low-resistance state. They act as unknown resistances in parallel with memristor 1222. The amount of current detected at the output-nanowire on column 3 would be significant, giving the impression that the memristor 1222 is in a low-resistance state.

Thus, a sneak path is a path that connects the row- and column-electrodes of a memristor in a high-resistance state, and whose remaining segments are determined by memristors in low-resistance states (see further: Y. Cassuto, S. Kvatinsky, and E. Yaakobi. Sneak-path constraints in memristor crossbar arrays. In Information Theory Proceedings (ISIT), 2013 IEEE International Symposium on, pages 156-160, 2013). It is a path through which a significant amount of current flows.

3. Crossbar Design for Evaluation of Boolean Formulas

This section further describes how some crossbar designs very naturally encode Boolean formulas, and how to use sneak paths to compute their value in accordance with various embodiments.

3.1 NNF: Negation Normal Form

An n-ary Boolean function maps an n-tuple of Boolean values to a Boolean value. It can be defined by a truth table of $2^n$ rows, one for each possible value an n-tuple may take. Alternatively and more concisely, it can be defined in terms of a few Boolean operators or connectives. A set of Boolean connectives is complete if every Boolean function can be defined by an expression that uses only the connectives in that set. The set consisting of the $\neg$ (negation), $\wedge$ (conjunction), and $\vee$ (disjunction) connectives is complete. So a Boolean function can be defined by a well-formed formula (wff) constructed as follows: (i) a Boolean (propositional) variable p is a wff; (ii) if $\phi$ is a wff, $\neg \phi$ is a wff; (iii) if $\phi_1$ and $\phi_2$ are wffs, $\phi_1 \wedge \phi_2$ is a wff, and (iv) if $\phi_1$ and $\phi_2$ are wffs, $\phi_1 \vee \phi_2$ is a wff.

One embodiment provides a method to evaluate Boolean formulas in negation normal form (NFF), which is defined by a slight change to these rules: the negation connective may be applied only to a propositional variable. A formula is in negation normal form (or is a negation normal form) if it is constructed as follows: (i) a literal, that is, a propositional variable p or $\neg p$, is in NNF, (ii) if $\phi_1$ and $\phi_2$ are in NNF, $\phi_1 \wedge \phi_2$ is in NNF, and (iii) if $\phi_1$ and $\phi_2$ are in NNF, $\phi_1 \vee \phi_2$ is in NNF.

Any wff constructed using only connectives $\neg$, $\wedge$ and $\vee$ can be transformed into an equivalent formula in negation normal form by repeatedly applying the De Morgan Laws: $\neg(p \wedge q) = \neg p \vee \neg q$, and $\neg(p \vee q) = \neg p \wedge \neg q$, and simplifying $\neg \neg p$ to p. Thus, the method presented below can be used to evaluate any Boolean expression.

3.2 Sneak Paths: A Tool

Sneak paths are generally regarded as a problem. They are paths for the current to flow in a crossbar that are determined by a series of memristors in low-resistance state. This invention provides a method that encodes a Boolean formula as the state of a crossbar such that there exists at least one sneak path between the input nanowire and the output nanowire when the Boolean formula evaluates to true.

The state of a crossbar depends on the states of its memristors, and of its row- and column-nanowires. Abstract models are introduced for these, which help to reason formally about the paths of interest: those between the input nanowire and the output nanowire that are determined by memristors in low-resistance states.

As FIG. 2 shows, a memristor 230 in a crossbar joins two nanowires 210, 220 that are in different planes, and perpendicular to each other. In this abstraction, a nanowire (row- or column-nanowire) 210, 220 may be in one of two states: either current is flowing through it, represented graphically by an arrow →; or current is not flowing through it, represented graphically by *.

Abstractly, a memristor 230 is an operation that may change the states of the nanowires 210, 220 it joins. A memristor 230 in a high-resistance state, represented graphically by ⊗, allows no current through it. The states of its nanowires 210, 220 cannot change, and thus ⊗ acts as an identity operator. A memristor 230 in a low-resistance state, represented graphically by ⊙, allows current to flow through it. If its two nanowires 210, 220 are in the same state, the ⊙ operation preserves their states. When they are in different states, ⊙ takes the nanowire in the * state to the → state. Thus, ⊙ is a flow-transfer operation.

Figure 3:
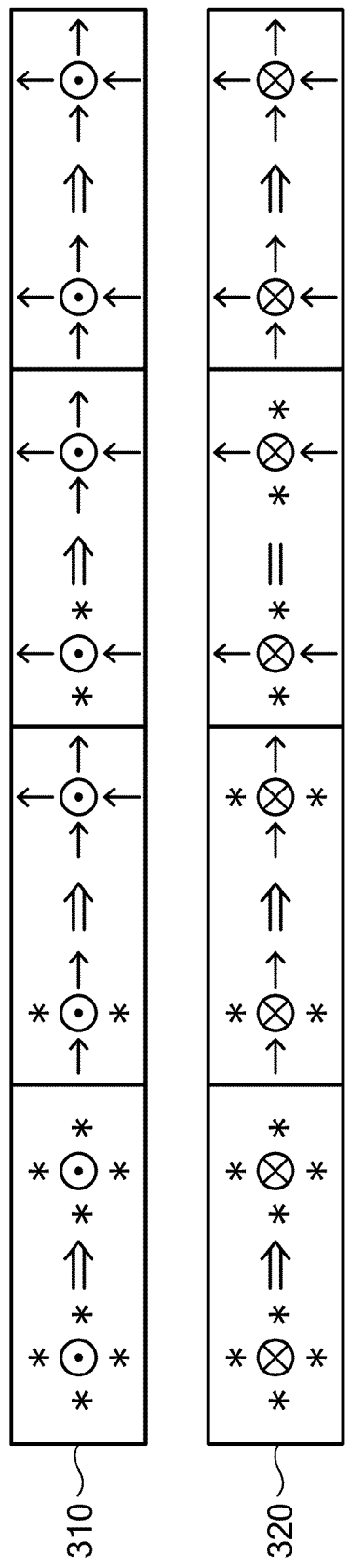
FIG. 3 is a graphical representation of operation of a memristor on various nanowire flows.

A two-dimensional abstract view of a memristor and the nanowires it joins has the memristor in the center, the state of one nanowire above and below it, and the state of the other to its left and right. Then the definitions of the memristor operations ⊙ and ⊗ become as shown in FIG. 3. Row 310 defines the memristor operation ⊙, which allows current to flow between the connected nanowires. Row 320 defines the memristor operation ⊗, which preserves the state of the connected nanowires as discussed above.

Figure 4:
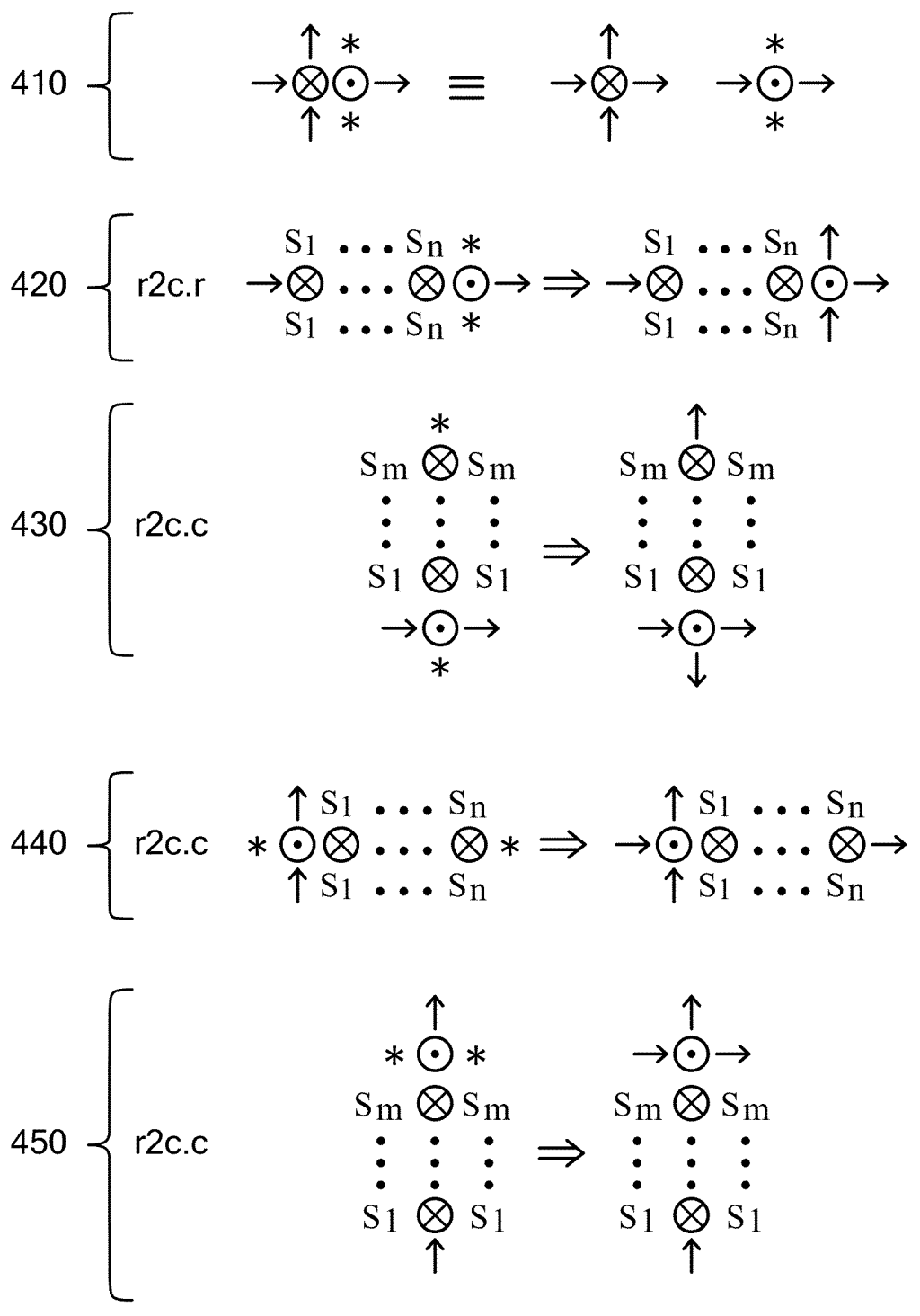

The physical sharing of nanowires in a row and in a column of a crossbar leads naturally to horizontal and vertical composition of memristor operations. FIG. 4 shows simpler notation for the state of a segment of a row or column of a crossbar. For example, neighboring memristors in states ⊗ and ⊙ are depicted as shown in row 410. Since they share a nanowire, there is no need to redundantly depict the state of this nanowire between them, and they can be presented in a compact form without the additional indicators.

Sneak paths are determined by a set of memristors in low-resistance states, ⊙. Memristor-row and -column segments may be viewed as operations to construct sneak paths. Let a subscripted s denote the state of a nanowire. It follows from the definitions of the ⊙ and ⊗ operations that current flowing through a row may be directed to a column without current by the operations r2c.r, shown in row 420, and r2c.c, shown in row 430. The operation shown in row 420 is the composition of a sequence of ⊗ operations with the ⊙ operation, all of which share their row-nanowire. Row 420 shows that whenever current is flowing through the shared row-nanowire, this is in state →; and no current is flowing through the column-nanowire connected to the ⊙ memristor, that is this nanowire is in the * state, current from the row-nanowire will be directed to this column, while the state of all the other intersected column-nanowires will be preserved. Likewise, the operation shown in row 430 is the composition of a sequence of ⊗ operations with the ⊙ operation, all of which share their column-nanowire. Row 430 shows that current is flowing through the row-nanowire connected to the memristor, and no current is flowing through the share column-nanowire, the operation will direct current from the row-nanowire to the shared column-nanowire, while preserving the state of all other intersecting row-nanowires.

Similarly, current flowing through a column may be directed to a row without current by the following operations c2r.r, shown in row 440, and c2r.c, shown in row 450.

As with operations ⊙ and ⊗, these operations do not take a nanowire from the → state to * state. Below, the s states are omitted for greater visual simplicity.

One other useful operation in this abstraction is an array of memristors in state ⊗: this array performs an identity operation on the set of nanowires it intersects. Such an array is denoted in an m by n array by $\otimes^{m,n}$.

These operations serve to construct sneak paths, and it is a sneak path that is used to evaluate a Boolean formula.

3.3 Crossbar Design to Evaluate NNFs

Boolean functions can be defined by a Boolean formula in negation normal form. This section specifies crossbar states that can be used to evaluate such formulas using sneak paths.

Let $\phi$ be a Boolean formula in negation normal form. An array of memristor states $M_\phi$ may be defined as follows.

For $\phi=1$, a literal, let ○=⊙ if 1 is true and ○=⊗ if 1 is false. Then, as shown in row 510, the literal 1, can be encoded by two memristors (○, 512, and ⊙, 514) in a column.

For a Boolean formula, $\phi$, of the form $\phi=\phi_1 \wedge \phi_2$, the array has $m_1+m_2-1$ rows and $n_1+n_2$ columns, and is demonstrated in row 520. As shown, $M_{\phi_1}^{m_1,n_1}$, is an $m_1$ by $n_1$ array that encodes $\phi_1$, and $M_{\phi_2}^{m_2,n_2}$ is an $m_2$ by $n_2$ array that encodes $\phi_2$. These arrays share a single row, $m_1$, which is the top row of $M_{\phi_1}^{m_1,n_1}$ and the bottom row of $M_{\phi_2}^{m_2,n_2}$. The rest of the $m_1+m_2-1$ by $n_1+n_2$ array is made up of two arrays of memristors in state ⊗: $\otimes^{m_2-1,n_1}$ and $\otimes^{m_1-1,n_2}$.

For a Boolean formula, $\phi$, of the form $\phi=\phi_1 \vee \phi_2$ the array has $m_1+m_2$ rows and $n_1+n_2+2$ columns, and is demonstrated in row 530. As shown, $M_{\phi_1}^{m_1,n_1}$, is an $m_1$ by $n_1$ array that encodes $\phi_1$, and $M_{\phi_2}^{m_2,n_2}$ is an $m_2$ by $n_2$ array that encodes $\phi_2$. The component arrays share no rows or columns. The array also includes additional vectors, 532, 534, 536 and 538. The column vector 532 of length $m_1$ and the row vector 534 of length $n_1+1$ provide a path to $M_{\phi_2}^{m_2,n_2}$, and the row vector 536 of length $n_2+1$ and the column vector 538 of length $m_2$ provide a path from $M_{\phi_1}^{m_1,n_1}$. The remainder of the $m_1+m_2$ by $n_1+n_2+2$ array is made up of two arrays of memristors in state ⊗: $\otimes^{m_2-1,n_1+1}$ and $\otimes^{m_1-1,n_2+1}$.

The array of memristor states $M_\phi$ is an operation on the nanowires it intersects. To compute the value of $\phi$, denoted $v(\phi)$, the array applied to a set of nanowires in which the first (or bottom) row is in state →, and the other rows and columns are initially in the * state.

Figure 6:
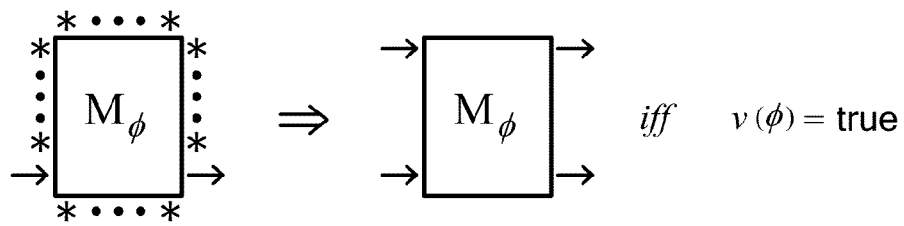
FIG. 6 is a graphical representation of operation of a memristor array on an input nanowire flow.

Given a crossbar in the state described above, which is induced by the formula $\phi$, there exists a sneak path that takes current from the first (or bottom) row to the last (or top) row if and only if (iff) the value of $\phi$ is true as shown in FIG. 6.

Theorem 1. Crossbar Computation of NNFs

This is shown by structural induction on the negation normal form $\phi$. Given a crossbar state in which initially only the nanowire in the first row is in the → state, a memristor array $M_\phi$ creates a sneak path that takes the nanowire in the last row to the → state, if and only if $v(\phi)$=true.

Base case: literal. Formula $\phi \equiv 1$. Assume the row 1 nanowire is in the → state, and the rest of the nanowires are initially in state *. (i) For v(1)=true, using the $M_l$ array in row 510 of FIG. 5, the ○, 512, is a ⊙. This ⊙ operator in row 1 takes the nanowire in and sets column 1 to state ↑. Then, the ⊙, 514, in row 2 takes row 2 to the → state. (ii) For v(l)=false, the ○, 512, becomes a ⊗ operator. This ⊗ operator in row 1 preserves the * state of column 1, and the ⊙, 514, in row 2 preserves the * state of row 2.

Inductive step: conjunction. The function $\phi \equiv \phi_1 \wedge \phi_2$ is shown the using the $M_{\phi_1 \wedge \phi_2}$ array in row 520. The initial state is row 1 is in the → state, and the rest of the nanowires are in state *. For $M_{\phi_2}$, the only nanowire in common with $M_{\phi_1}$ is row $m_1$. For the rest of its nanowires, their initial * state is preserved by the ⊗ arrays. Then by the induction hypothesis, $M_{\phi_1}$ creates a sneak path that takes row $m_1$ to the → state iff $v(\phi_1)$=true. (i) For $v(\phi_1)$=false there is no sneak path that takes row $m_1$ to the → state. So the required initial state for $M_{\phi_2}$ is not reached, and no sneak path to the last row of $M_{\phi_1 \wedge \phi_2}$ can be created. (ii) For $v(\phi_1)$=true there is a sneak path that takes row $m_1$ to the → state. Then by the induction hypothesis, $M_{\phi_2}$ creates a sneak path that takes its last row to the → state iff $v(\phi_2)$=true. Thus, $M_{\phi_1 \wedge \phi_2}$ creates a sneak path that takes its last row to the → state iff $v(\phi_1)$=true and $v(\phi_2)$=true.

Inductive step: disjunction. The function $\phi \equiv \phi_1 \vee \phi_2$ is shown the using the $M_{\phi_1 \vee \phi_2}$ array in row 530. The initial state is row 1 is in the → state, and the rest of the nanowires are in state *. (i) The initial state for the nanowires of $M_{\phi_1}$ holds. The column segment 532 to the left of $M_{\phi_1}$ preserves the initial state of its rows: ⊙ preserves the → state, and ⊗ preserves state *. Then by the induction hypothesis, $M_{\phi_1}$ creates a sneak path that takes its last row to state → iff $v(\phi_1)$=true. By r2c.r, the row segment 536 to the right of $M_{\phi_1}$'s last row takes the last column of $M_{\phi_1 \vee \phi_2}$ to state ↑. Last, by c2r.c, the segment of this column 538 above row $m_1$ takes the last row of $M_{\phi_1 \vee \phi_2}$ to state →. (ii) The initial state for the nanowires of $M_{\phi_2}$ also holds. By r2c.c, the column segment 532 to the left of $M_{\phi_1}$ takes column 1 to state ↑. By c2r.r, the row segment 534 to the left of the first row of $M_{\phi_2}$ takes that row to state →. The ⊗ arrays preserve the state of all the other nanowires. Then by the induction hypothesis, $M_{\phi_2}$ creates a sneak path that takes the last row of $M_{\phi_1 \vee \phi_2}$ to state → iff $v(\phi_2)$=true. Thus, $M_{\phi_1 \vee \phi_2}$ creates a sneak path that takes its last row to state → iff $v(\phi_1)$=true or $v(\phi_2)$=true.

4. Example Embodiment

Figure 7:
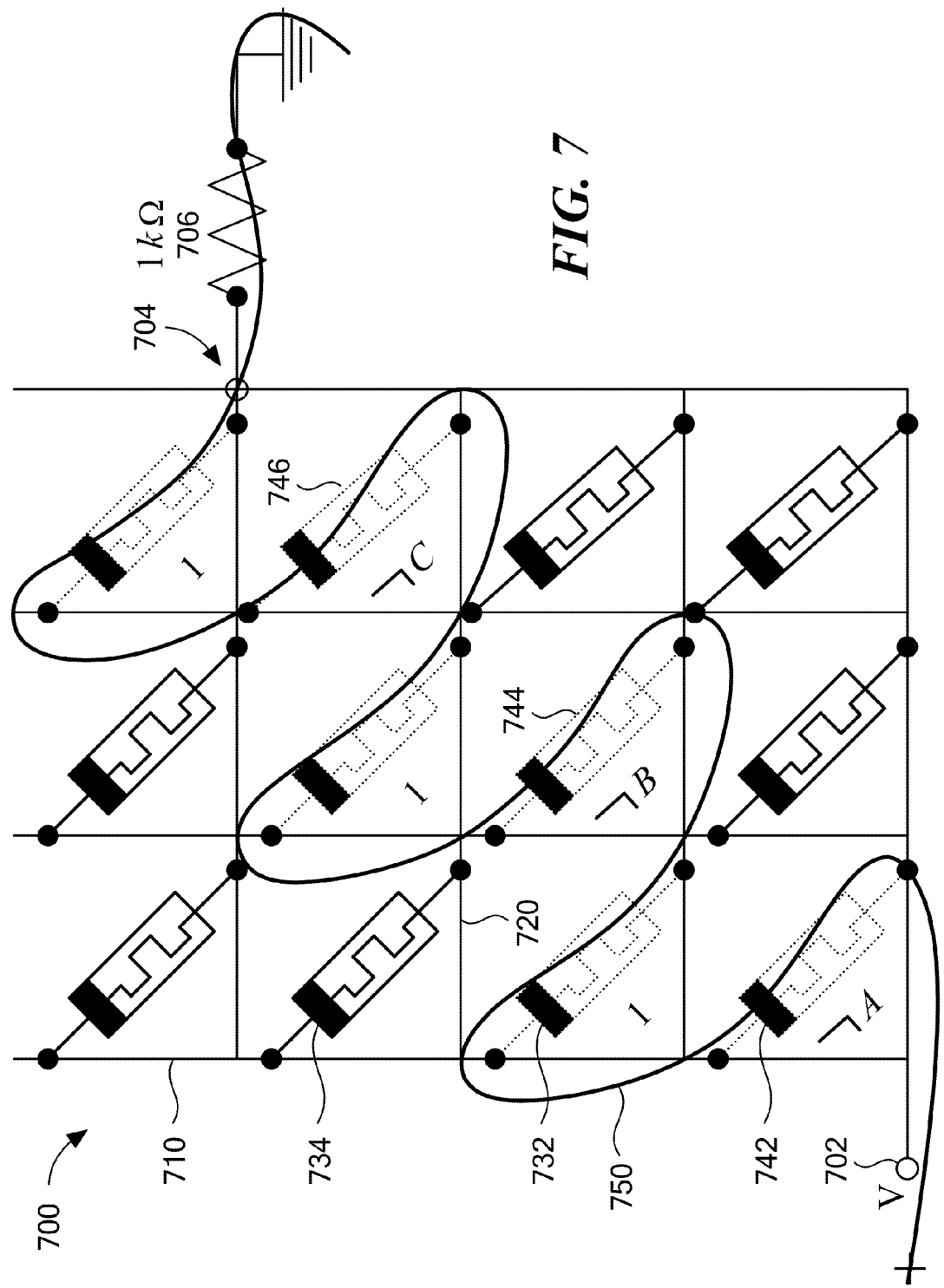
FIG. 7 illustrates a circuit design for a 1-bit addition circuit in accordance with an embodiment.

One non-limiting embodiment is a design of a small Boolean formula and a 1-bit addition circuit. The circuit design for computing the formula ¬A∧¬B∧¬C is shown in FIG. 7. The crossbar lattice 700 includes a series of column nanowires 710 and row nanowires 720 which are connected by various memristors 732, 734, 742, 744, 746. One row nanowire 702 operates as the row 1 nanowire and another row nanowire operates as the last row nanowire 704 which provides an output for the crossbar lattice 700. This last row nanowire 704 is connected to a resistor 706, shown as a 1 kΩ resistor, and through it to ground. Dark colored memristors 734 indicate memristors in the ⊗ state (having a value of 0) and lightly colored memristors 732, 742, 744, 746 are those in the ⊙ state (having a value of 1). Memristor 742 is assigned the value of ¬A, memristor 744 is assigned the value of ¬B and memristor 746 is assigned the value of ¬C. The values assigned to the various memristors may be seen in the following matrix (1):

$$\begin{bmatrix} 0 & 0 & 1 \\ 0 & 1 & \neg C \\ 1 & \neg B & 0 \\ \neg A & 0 & 0 \end{bmatrix}. \quad (1)$$

The memristor-based crossbar example embodies the formula ¬A∧¬B∧¬C recognizing the pattern "A=0, B=0, C=0". As a non-limiting example, a turned-off resistance is 10,000Ω, and 1,000Ω is the turned-on resistance. The curve 750 shows the flow of the current through the low-resistance path in the crossbar array 700 when the memristors for ¬A 742, ¬B 744, and ¬C 746 are turned-on. When any of these memristors is turned-off, there is no low-resistance path from +V to ground in the crossbar.

The ¬A∧¬B∧¬C matrix (1) can be viewed as a conjunction of two matrices:

$$\begin{bmatrix} 1 \\ \neg A \end{bmatrix} \quad (2)$$

and $$\begin{bmatrix} 0 & 1 \\ 1 & \neg C \\ \neg B & 0 \end{bmatrix}. \quad (3)$$

Note that matrix (3) can also be seen as a conjunction of two further matrices:

$$\begin{bmatrix} 1 \\ \neg B \end{bmatrix} \quad (4)$$

and $$\begin{bmatrix} 1 \\ \neg C \end{bmatrix}. \quad (5)$$

Figure 5:
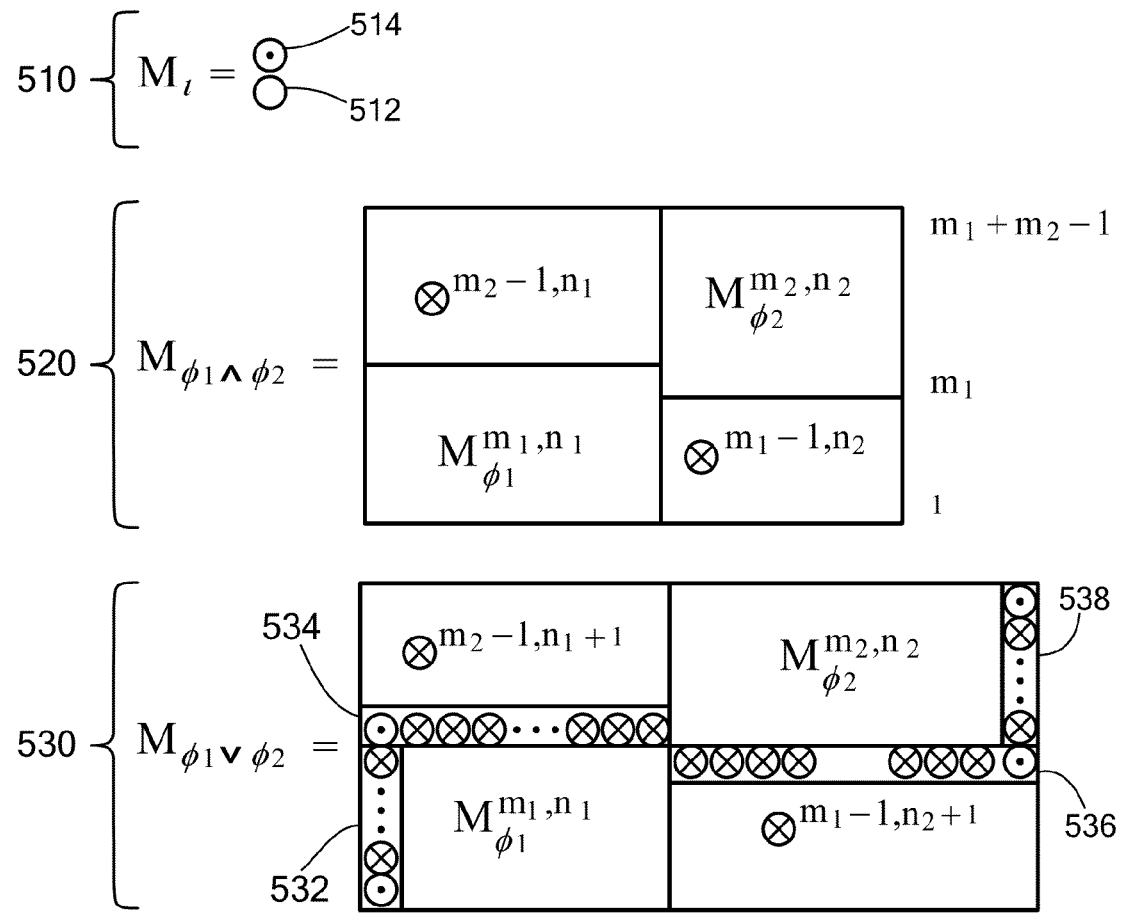
FIG. 5 is a graphical representation of various memristor arrays.

Thus, the matrices (1) and (3) follow the format shown in row 520 of FIG. 5.

Alternatively, this can be seen as a conjunction of the two matrices:

$$\begin{bmatrix} 1 \\ \neg C \end{bmatrix} \quad (6)$$

and $$\begin{bmatrix} 0 & 1 \\ 1 & \neg B \\ \neg A & 0 \end{bmatrix}, \quad (7)$$

which in turn is a conjunction of:

$$\begin{bmatrix} 1 \\ \neg A \end{bmatrix} \quad (8)$$

and $$\begin{bmatrix} 1 \\ \neg B \end{bmatrix}. \quad (9)$$

Figure 8:
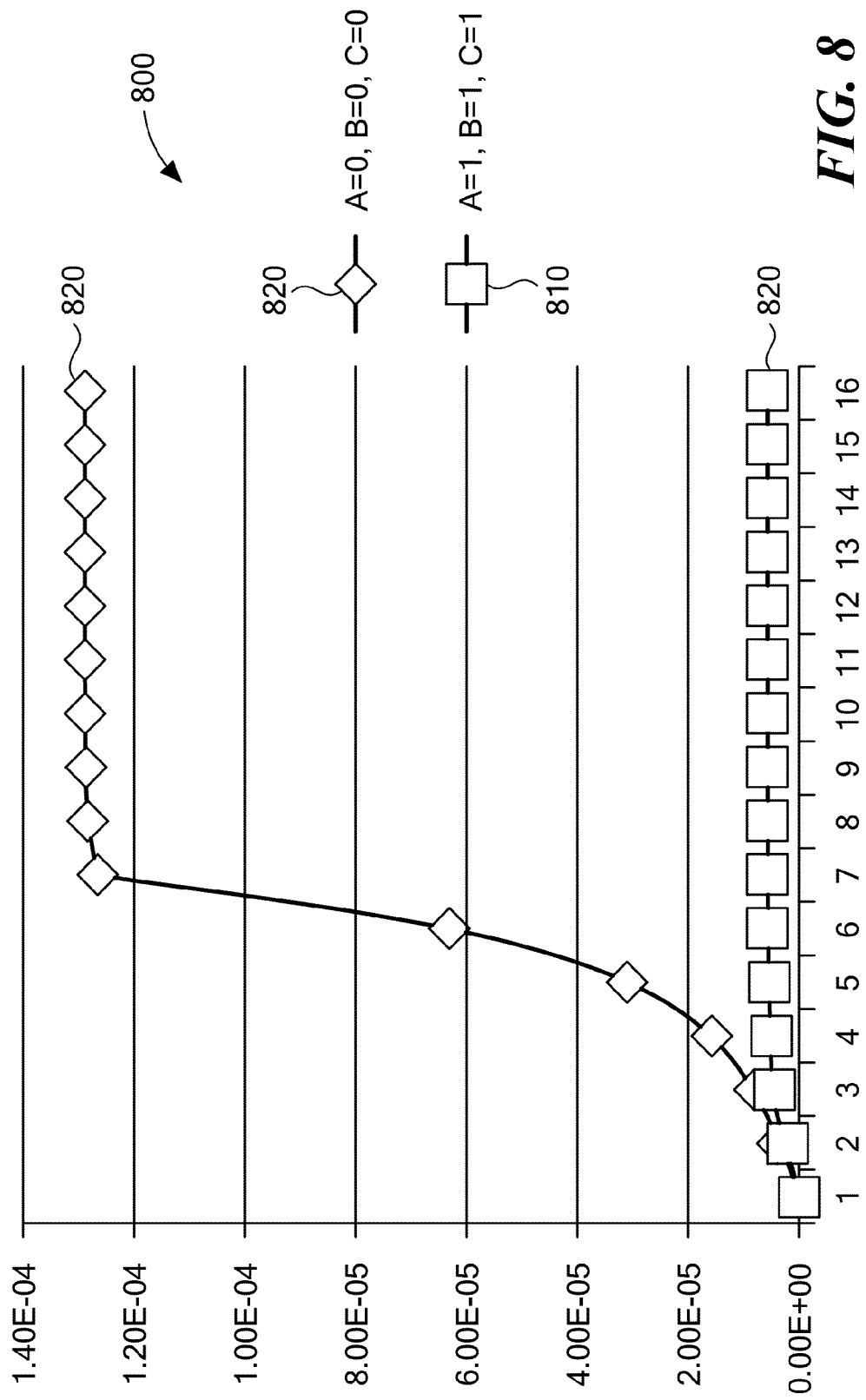
FIG. 8 shows the results of operation of the circuit shown in FIG. 7.

FIG. 8 is a graph 800 which shows the results the circuit shown in FIG. 7 for two cases.

For the case 820 in which the formula is true, when each of ¬A, ¬B and ¬C are true, the current owing through the voltage source is of the order of $10^{-4}$ amperes. For the case 810 when ¬A, ¬B and ¬C are false, and hence the formula is false, the current owing through the voltage source is less than $10^{-5}$.

4.2 1-Bit Addition Circuit

Figure 9:
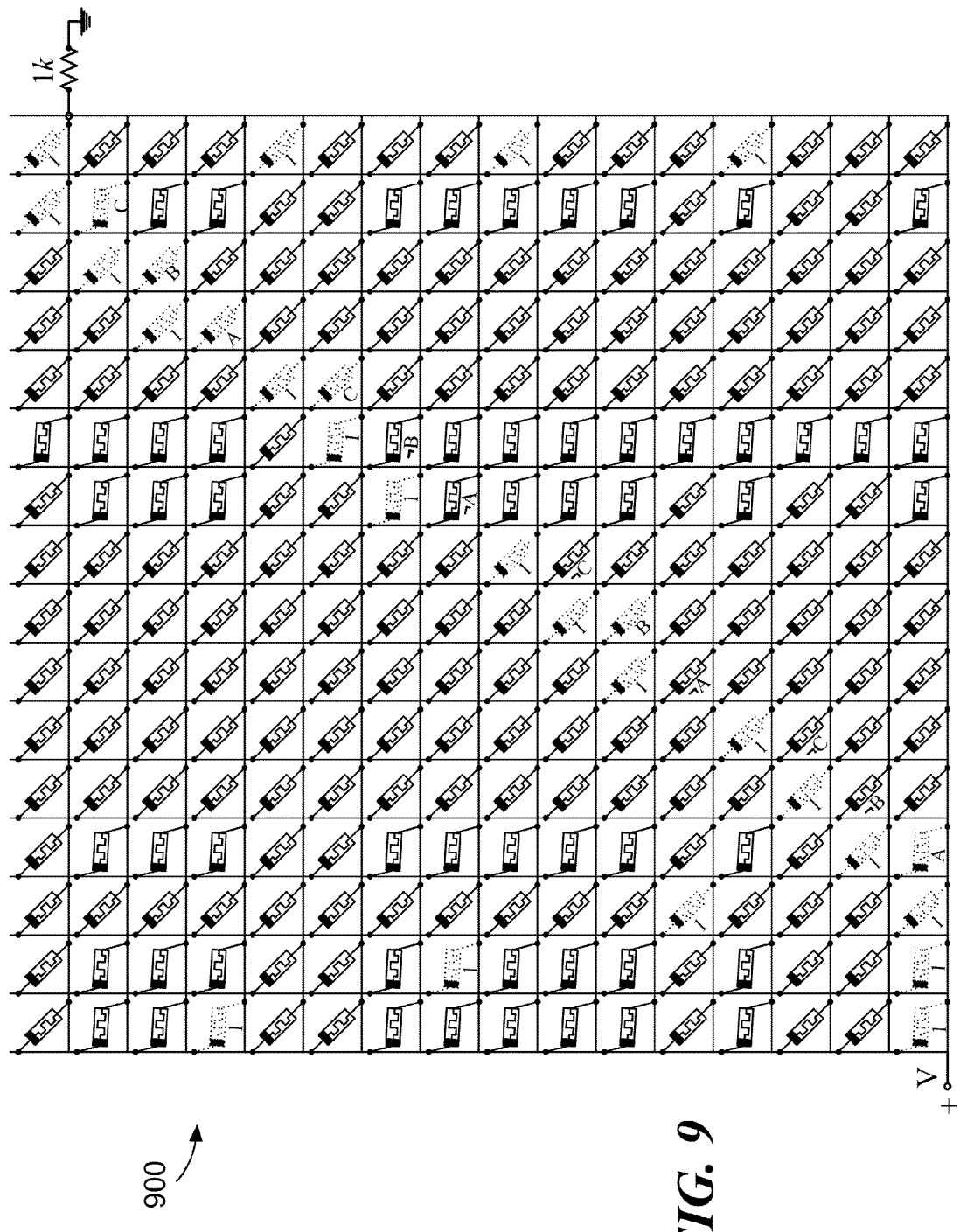
FIG. 9 illustrates a circuit design for another circuit in accordance with another embodiment.

FIG. 9 illustrates a design 900 of a nano-crossbar for computing the sum-bit of a 1-bit adder. The values of the memristors in the design 900 are given as follows, each row and column location in design 900 corresponding to a position in the table below:

$$\begin{bmatrix}
0 & 0 & 0 & 0 & 0 & 0 & 0 & 0 & 0 & 0 & 0 & 0 & 0 & 0 & 1 & 1 \\
0 & 0 & 0 & 0 & 0 & 0 & 0 & 0 & 0 & 0 & 0 & 0 & 0 & 1 & C & 0 \\
0 & 0 & 0 & 0 & 0 & 0 & 0 & 0 & 0 & 0 & 0 & 0 & 1 & B & 0 & 0 \\
1 & 0 & 0 & 0 & 0 & 0 & 0 & 0 & 0 & 0 & 0 & 0 & A & 0 & 0 & 0 \\
0 & 0 & 0 & 0 & 0 & 0 & 0 & 0 & 0 & 0 & 0 & 1 & 1 & 0 & 0 & 1 \\
0 & 0 & 0 & 0 & 0 & 0 & 0 & 0 & 0 & 0 & 1 & C & 0 & 0 & 0 & 0 \\
0 & 0 & 0 & 0 & 0 & 0 & 0 & 0 & 0 & 0 & 1 & \neg B & 0 & 0 & 0 & 0 \\
0 & 1 & 0 & 0 & 0 & 0 & 0 & 0 & 0 & 0 & \neg A & 0 & 0 & 0 & 0 & 0 \\
0 & 0 & 0 & 0 & 0 & 0 & 0 & 0 & 0 & 1 & 0 & 0 & 0 & 0 & 0 & 1 \\
0 & 0 & 0 & 0 & 0 & 0 & 0 & 0 & 1 & \neg C & 0 & 0 & 0 & 0 & 0 & 0 \\
0 & 0 & 0 & 0 & 0 & 0 & 0 & 1 & B & 0 & 0 & 0 & 0 & 0 & 0 & 0 \\
0 & 0 & 0 & 0 & 0 & 0 & 1 & \neg A & 0 & 0 & 0 & 0 & 0 & 0 & 0 & 0 \\
0 & 0 & 0 & 0 & 0 & 1 & 0 & 0 & 0 & 0 & 0 & 0 & 0 & 0 & 0 & 1 \\
0 & 0 & 0 & 0 & 1 & \neg C & 0 & 0 & 0 & 0 & 0 & 0 & 0 & 0 & 0 & 0 \\
0 & 0 & 0 & 1 & \neg B & 0 & 0 & 0 & 0 & 0 & 0 & 0 & 0 & 0 & 0 & 0 \\
1 & 1 & 1 & A & 0 & 0 & 0 & 0 & 0 & 0 & 0 & 0 & 0 & 0 & 0 & 0
\end{bmatrix} \quad (10)$$

This design represents the Boolean equation: $(A \wedge \neg B \wedge \neg C) \vee (\neg A \wedge B \wedge \neg C) \vee (\neg A \wedge \neg B \wedge C) \vee (A \wedge B \wedge C)$. The results of the nano-crossbar design 900 are presented in Table 1. The measured voltage drop relates very well with the expected logical sum of the 1-bit adder: a voltage drop in excess of 1 volt indicates the logical value true, while a voltage drop below 0.5 volts indicates the logical value false.

TABLE 1

| A | B | $C_{in}$ | Sum-Logical | Sum-Voltage |
|---|---|---|---|---|
| 0 | 0 | 0 | 0 | 0.35 |
| 0 | 1 | 0 | 1 | 1.14 |
| 1 | 0 | 0 | 1 | 1.2 |
| 1 | 1 | 0 | 0 | 0.36 |
| 0 | 0 | 1 | 1 | 1.21 |

TABLE 1-continued

| A | B | $C_{in}$ | Sum-Logical | Sum-Voltage |
|---|---|---|---|---|
| 0 | 1 | 1 | 0 | 0.36 |
| 1 | 0 | 1 | 0 | 0.36 |
| 1 | 1 | 1 | 1 | 1.36 |

Various embodiments provide a design for the evaluation of Boolean formulas using memristor-based crossbars. In view of the conventional solutions, this approach is counterintuitive. It transfigures sneak paths, typically regarded as a problem, into first-class design elements.

In an alternative non-limiting embodiment, an array of memristors may be assigned values which provide a logically equivalent result, while not being exactly identical. For example, matrix (10) may be rewritten as the slightly larger array:

$$\begin{bmatrix}
0 & 0 & 0 & 0 & 0 & 0 & 0 & 0 & 0 & 0 & 0 & 0 & 0 & 0 & 1 & 1 \\
0 & 0 & 0 & 0 & 0 & 0 & 0 & 0 & 0 & 0 & 0 & 0 & 0 & 1 & C & 0 \\
0 & 0 & 0 & 0 & 0 & 0 & 0 & 0 & 0 & 0 & 0 & 0 & 1 & B & 0 & 0 \\
1 & 0 & 0 & 0 & 0 & 0 & 0 & 0 & 0 & 0 & 0 & 0 & A & 0 & 0 & 0 \\
0 & 0 & 0 & 0 & 0 & 0 & 0 & 0 & 0 & 0 & 0 & 1 & 1 & 0 & 0 & 1 \\
0 & 0 & 0 & 0 & 0 & 0 & 0 & 0 & 0 & 0 & 1 & C & 0 & 0 & 0 & 0 \\
0 & 0 & 0 & 0 & 0 & 0 & 0 & 0 & 0 & 0 & 1 & \neg B & 0 & 0 & 0 & 0 \\
0 & 1 & 0 & 0 & 0 & 0 & 0 & 0 & 0 & 0 & \neg A & 0 & 0 & 0 & 0 & 0 \\
0 & 0 & 0 & 0 & 0 & 0 & 0 & 0 & 0 & 1 & 0 & 0 & 0 & 0 & 0 & 0 \\
0 & 0 & 0 & 0 & 0 & 0 & 0 & 0 & 1 & \neg C & 0 & 0 & 0 & 0 & 0 & 0 \\
0 & 0 & 0 & 0 & 0 & 0 & 0 & 1 & B & 0 & 0 & 0 & 0 & 0 & 0 & 0 \\
0 & 0 & 0 & 0 & 0 & 0 & 1 & \neg A & 0 & 0 & 0 & 0 & 0 & 0 & 0 & 0 \\
0 & 0 & 0 & 0 & 0 & 1 & 0 & 0 & 0 & 0 & 0 & 0 & 0 & 0 & 0 & 0 \\
0 & 0 & 0 & 0 & 1 & \neg C & 0 & 0 & 0 & 0 & 0 & 0 & 0 & 0 & 0 & 0 \\
0 & 0 & 0 & 1 & \neg B & 0 & 0 & 0 & 0 & 0 & 0 & 0 & 0 & 0 & 0 & 0 \\
1 & 1 & 1 & A & 0 & 0 & 0 & 0 & 0 & 0 & 0 & 0 & 0 & 0 & 0 & 0
\end{bmatrix} \quad (11)$$

Matrix (11) can be generated by successive combination of sub-matrices such as shown in row 530 in FIG. 5. Matrix (12), shown below, represents the same data as Matrix (11) with the row and column sections (similar to 532, 534, 536, 538) shown in $\odot$ and $\otimes$ notation:

$$\begin{bmatrix}
0 & 0 & 0 & 0 & 0 & 0 & 0 & 0 & 0 & 0 & 0 & 0 & 0 & 0 & 0 & 1 & \odot \\
0 & 0 & 0 & 0 & 0 & 0 & 0 & 0 & 0 & 0 & 0 & 0 & 0 & 0 & 1 & C & \otimes \\
0 & 0 & 0 & 0 & 0 & 0 & 0 & 0 & 0 & 0 & 0 & 0 & 0 & 1 & B & 0 & \otimes \\
\odot & \otimes & \otimes & \otimes & \otimes & \otimes & \otimes & \otimes & \otimes & \otimes & \otimes & \otimes & A & 0 & 0 & \otimes \\
\otimes & 0 & 0 & 0 & 0 & 0 & 0 & 0 & 0 & 0 & 0 & 1 & \odot & \otimes & \otimes & \otimes & \odot \\
\otimes & 0 & 0 & 0 & 0 & 0 & 0 & 0 & 0 & 0 & 1 & C & \otimes & 0 & 0 & 0 \\
\otimes & 0 & 0 & 0 & 0 & 0 & 0 & 0 & 0 & 1 & \neg B & 0 & \otimes & 0 & 0 & 0 \\
\otimes & \odot & \otimes & \otimes & \otimes & \otimes & \otimes & \otimes & \otimes & \neg A & 0 & 0 & \otimes & 0 & 0 & 0 \\
\otimes & \otimes & 0 & 0 & 0 & 0 & 0 & 1 & \odot & \otimes & \otimes & \otimes & \odot & 0 & 0 & 0 \\
\otimes & \otimes & 0 & 0 & 0 & 0 & 1 & \neg C & \otimes & 0 & 0 & 0 & 0 & 0 & 0 & 0 \\
\otimes & \otimes & 0 & 0 & 0 & 0 & 1 & B & 0 & \otimes & 0 & 0 & 0 & 0 & 0 & 0 \\
\otimes & \otimes & \odot & \otimes & \otimes & \otimes & \neg A & 0 & 0 & \otimes & 0 & 0 & 0 & 0 & 0 & 0 \\
\otimes & \otimes & \otimes & 0 & 0 & 1 & \otimes & \otimes & \otimes & \odot & 0 & 0 & 0 & 0 & 0 & 0 \\
\otimes & \otimes & \otimes & 0 & 1 & \neg C & 0 & 0 & 0 & 0 & 0 & 0 & 0 & 0 & 0 & 0 \\
\otimes & \otimes & \otimes & 1 & \neg B & 0 & 0 & 0 & 0 & 0 & 0 & 0 & 0 & 0 & 0 & 0 \\
\odot & \odot & \odot & A & 0 & 0 & 0 & 0 & 0 & 0 & 0 & 0 & 0 & 0 & 0 & 0
\end{bmatrix} \quad (12)$$

As shown, matrix (12) is the result of a combination of matrices by the disjunction operator. The first combination being made by combining the following two matrices:

$$\begin{bmatrix} 0 & 0 & 1 \\ 0 & 1 & \neg C \\ 1 & \neg B & 0 \\ A & 0 & 0 \end{bmatrix}, \text{ and} \quad (13)$$

$$\begin{bmatrix} 0 & 0 & 1 \\ 0 & 1 & \neg C \\ 1 & B & 0 \\ \neg A & 0 & 0 \end{bmatrix}. \quad (14)$$

This results in the following matrix:

$$\begin{bmatrix} 0 & 0 & 0 & 0 & 0 & 0 & 1 & \odot \\ 0 & 0 & 0 & 0 & 0 & 1 & \neg C & \otimes \\ 0 & 0 & 0 & 0 & 1 & B & 0 & \otimes \\ \odot & \otimes & \otimes & \otimes & \neg A & 0 & 0 & \otimes \\ \otimes & 0 & 0 & 1 & \otimes & \otimes & \otimes & \odot \\ \otimes & 0 & 1 & \neg C & 0 & 0 & 0 & 0 \\ \otimes & 1 & \neg B & 0 & 0 & 0 & 0 & 0 \\ \odot & A & 0 & 0 & 0 & 0 & 0 & 0 \end{bmatrix}. \quad (15)$$

The matrix (15) can then be combined, using the same technique for disjunction, with:

$$\begin{bmatrix} 0 & 0 & 1 \\ 0 & 1 & C \\ 1 & \neg B & 0 \\ \neg A & 0 & 0 \end{bmatrix}. \quad (16)$$

The matrix (11) is generated by combining the resulting matrix from the combination of matrix (15) and (16) with:

$$\begin{bmatrix} 0 & 0 & 1 \\ 0 & 1 & C \\ 1 & B & 0 \\ A & 0 & 0 \end{bmatrix}. \quad (17)$$

The techniques described above can be used to create a new algorithmic framework for constructing memristor-based nano-crossbar circuits that can implement programs involving arithmetic and logical operations as well as randomized algorithms. The resulting computing architecture has applications in several important areas of computational data science and cyber-security, including extreme-scale simulation of complex systems such as agent-based models, biochemical reactions and fluid dynamics computations. By accelerating satisfiability solving, it also creates new avenues for accelerating other NP-hard problems.

As described above, various embodiments provide a method, apparatus and computer program(s) to design for the evaluation of Boolean formulas using memristor-based crossbars.

Accordingly, using the techniques described above, any complex Boolean equation can be broken down into a set of smaller equations and a combining operation (e.g., disjunction or conjunction). These smaller equations may also be broken down into even smaller equations until a set of single value equations is found. Using the smaller equations and the combining operations, a matrix of memristor values may be determine such that when assigned to memristors in a crossbar lattice the crossbar lattice operates to provide a logical result in accordance with the complex Boolean equation.

When combining smaller equations using a conjunction combining operation (e.g., such as a logical AND operation), the output of the first equation is applied to the input of the second equation, such as, by having the last row of the first equation and the first row of the second equation be the same row. In contrast, when combining smaller equations using a disjunction combining operation (e.g., such as a logical OR operation), additional path vectors are provided so that the input provided to the first equation is also applied to the second equation and so that the output of the first equation is combined with the output of the second equation (in other words, the output of the combination represents the output of either one of the smaller equations).

In one embodiment, the size of the matrix is determined by the Boolean equation.

In an alternative embodiment, such as when dealing with an array of set size, the matrix of the Boolean equation may be expanded to fit the size of the array by combining the matrix of the Boolean equation with a $\otimes$ array. As one non-limiting example, if the matrix of the Boolean equation is a 4×3 matrix and is to be applied to a 10×10 matrix, the Boolean equation may be combined using the disjunction operation with a $\otimes$ $^{6,5}$ array. In another non-limiting example, the combination may omit the additional path vectors (such as vectors 532, 534 in FIG. 5) to provide the input to the second equation (if the second equation is the $\otimes$ array) or omit the additional path vectors (such as vectors 536, 538) to combine the outputs (if the first equation is the $\otimes$ array). This allows the matrix of the Boolean equation to be increased in size by a single column.

Figure 10:
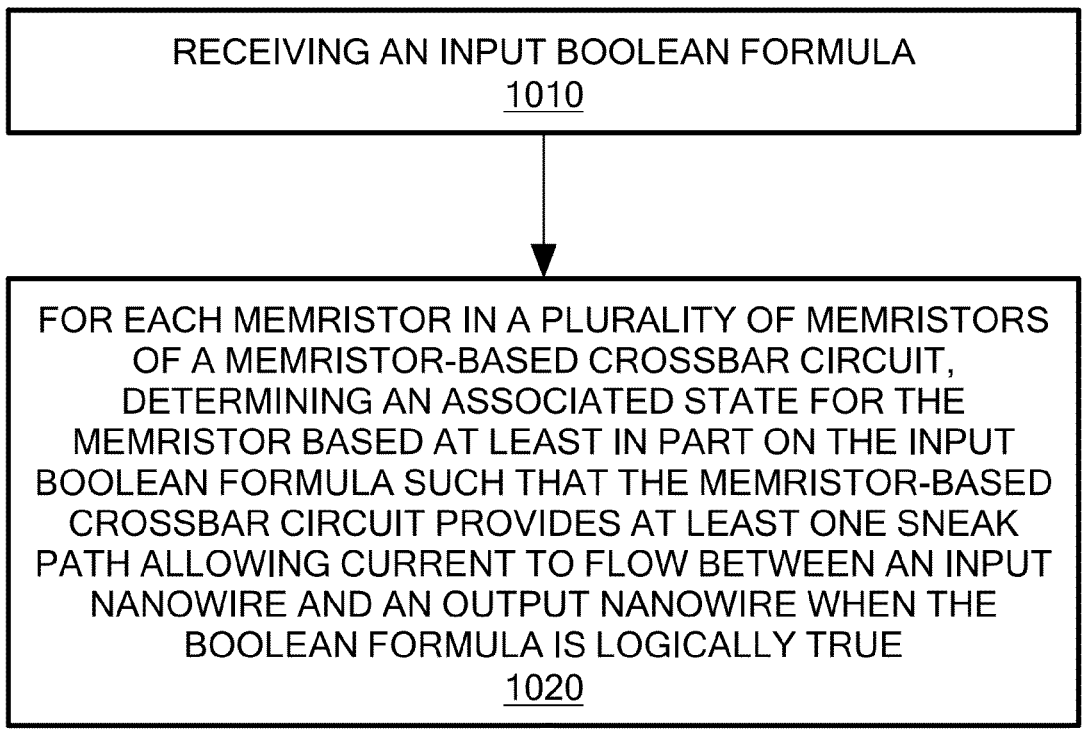
FIG. 10 is a logic flow diagram that illustrates the operation of a method, and a result of execution of computer program instructions embodied on a computer readable memory, in accordance with various embodiments.

FIG. 10 is a logic flow diagram that illustrates a method, and a result of execution of computer program instructions, in accordance with various embodiments. In accordance with an embodiment a method performs, at Block 1010, a step of receiving an input Boolean formula. The method also performs for each memristor in a plurality of memristors of a memristor-based crossbar circuit, determining an associated state for the memristor based at least in part on the input Boolean formula such that the memristor-based crossbar circuit provides at least one sneak path allowing current to flow between an input nanowire and an output nanowire when the Boolean formula is logically true. The associated state is either a flow state or a no-flow state.

The various blocks shown in FIG. 10 may be viewed as method steps, as operations that result from use of computer program code, and/or as one or more logic circuit elements constructed to carry out the associated function(s).

A first embodiment provides a circuit for evaluation of Boolean formulas using memristor-based crossbars. The circuit includes a crossbar lattice having an input nanowire, an output nanowire and a plurality of memristors. Each memristor in the plurality of memristors is assigned a flow state or a no-flow state in accordance with a Boolean formula such that the circuit provides at least one sneak path allowing current to flow between the input nanowire and the output nanowire when the Boolean formula is logically true.

In an additional embodiment of the circuit above, the crossbar lattice includes a plurality of row nanowires. The plurality of row nanowires is arranged in rows and includes the input nanowire and the output nanowire. The crossbar lattice also includes a plurality of column nanowires which are arranged in columns. Each memristor in the plurality of memristors connects a unique pair of nanowires. The unique pair includes an associated row nanowire and an associated column nanowire. The memristors in the crossbar lattice includes are configured to allow the current to flow through the memristors between the associated row nanowire and the associated column nanowire when in the flow state and configured to prevent the current from flowing through the memristors between the associated row nanowire and the associated column nanowire when in the no-flow state In a further embodiment of the circuit above, the plurality of row nanowires are arranged in parallel rows and the plurality of column nanowires are arranged in parallel columns. The parallel rows are perpendicular to the parallel columns.

In an additional embodiment of any one of the circuits above, the input nanowire is a first row nanowire in the plurality of row nanowires which is located in a first end position and the output nanowire is a second row nanowire which is located in a second end position opposite the first end position.

In a further embodiment of any one of the circuits above, a sneak path is defined as interconnected nanowires through which the current flows in crossbars.

In an additional embodiment of any one of the circuits above, the circuit is configured to receive a voltage only at the input nanowire.

In a further embodiment of any one of the circuits above, the output nanowire is connected to ground via a resistor.

An additional embodiment provides a method for evaluation of Boolean formulas using a memristor-based crossbars circuit. The method includes receiving an input Boolean formula. The method also includes, for each memristor in a plurality of memristors of a memristor-based crossbar circuit, determining an associated state for the memristor based at least in part on the input Boolean formula such that the memristor-based crossbar circuit provides at least one sneak path allowing current to flow between an input nanowire and an output nanowire when the Boolean formula is logically true. The associated state is a flow state or a no-flow state.

In an additional embodiment of the method above, the memristor-based crossbar circuit includes a crossbar lattice having an input nanowire, an output nanowire and a plurality of memristors. The memristor-based crossbar circuit also includes a plurality of row nanowires arranged in rows and a plurality of column nanowires arranged in columns. Each memristor connects a unique pair of nanowires. The unique pair includes an associated row nanowire and an associated column nanowire. A memristor is configured to allow the current to flow through the memristors between the associated row nanowire and the associated column nanowire when in a flow state and configured to prevent the current from flowing through the memristors between the associated row nanowire and the associated column nanowire when in a no-flow state.

In a further embodiment of any one of the methods above, the method also includes setting each memristor in the memristor-based crossbar circuit to the associated states, providing a voltage to the input nanowire, measuring a voltage difference across a resistor connected to the output nanowire and assigning a result to the Boolean formula based on the voltage difference.

In an additional embodiment of any one of the methods above, assigning the result includes, in response to the voltage difference being relatively high, assigning a value of true to the result, and, in response to the voltage difference being relatively low, assigning a value of false to the result.

In a further embodiment of any one of the methods above, the method includes determining the measured voltage difference to be relatively high when the measured voltage difference exceeds a first threshold value, and determining the measured voltage difference to be relatively low when the measured voltage difference is below a second threshold value.

In an additional embodiment of any one of the methods above, the input Boolean formula is a combination of a first sub-formula and a second sub-formula. The first sub-formula and the second sub-formula create the input Boolean formula when combined using a Boolean operation. The Boolean operation is either a disjunction operation or a conjunction operation.

In a further embodiment of the method above, the Boolean operation is the conjunction operation. Determining the associated state for each memristor includes determining the associated state for each memristor in a first subset of memristors in the plurality of memristors based at least in part on the first sub-formula, and determining the associated state for each memristor in a second subset of memristors in the plurality of memristors based at least in part on the second sub-formula. An output row of the first subset is an input row of the second subset. Determining the associated state also includes determining the no-flow state for a third subset of memristors in the plurality of memristors and a fourth memristors in the plurality of memristors.

In an additional embodiment of the method above, the Boolean operation is the disjunction operation and determining the associated state for each memristor includes determining the associated state for each memristor in a first subset of memristors in the plurality of memristors based at least in part on the first sub-formula. Determining the associated state also includes determining the associated state for each memristor in a second subset of memristors in the plurality of memristors based at least in part on the second sub-formula and determining the associated state for each memristor in a first column path of memristors in the plurality of memristors and each memristor in a first row path of memristors in the plurality of memristors. The first column path and the first row path provide a first input to both the first subset and the second subset. Determining the associated state also includes determining the associated state for each memristor in a second row path of memristors in the plurality of memristors and each memristor in a second column path of memristors in the plurality of memristors. The second row path and the second column path provide a logical OR combination of a first output from the first subset and a second output from the second subset. Lastly, determining the associated state includes determining the no-flow state for a third subset of memristors in the plurality of memristors and a fourth memristors in the plurality of memristors.

In an additional embodiment of any one of the methods above, the current flows between the input nanowire and the output nanowire only when the Boolean formula is logically true.

In a further embodiment of any one of the methods above, the Boolean formula is in negation normal form.

Another embodiment provides a computer readable medium for evaluation of Boolean formulas using a memristor-based crossbars circuit. The computer readable medium is tangibly encoded with a computer program executable by a processor to perform actions. The actions include receiving an input Boolean formula; and for each memristor in a plurality of memristors of a memristor-based crossbar circuit, determining an associated state for the memristor based at least in part on the input Boolean formula such that the memristor-based crossbar circuit provides at least one sneak path allowing current to flow between an input nanowire and an output nanowire when the Boolean formula is logically true. The associated state is either a flow state or a no-flow state.

In a further embodiment of the computer readable medium above, the input Boolean formula is a combination of a first sub-formula and a second sub-formula. The first sub-formula and the second sub-formula create the input Boolean formula when combined using a Boolean conjunction operation. Determining the associated state for each memristor includes determining the associated state for each memristor in a first subset of memristors in the plurality of memristors based at least in part on the first sub-formula; determining the associated state for each memristor in a second subset of memristors in the plurality of memristors based at least in part on the second sub-formula, wherein an output row of the first subset is an input row of the second subset; and determining the no-flow state for a third subset of memristors in the plurality of memristors and a fourth memristors in the plurality of memristors.

In an additional embodiment of the computer readable medium above, the input Boolean formula is a combination of a first sub-formula and a second sub-formula. The first sub-formula and the second sub-formula create the input Boolean formula when combined using a Boolean disjunction operation. Determining the associated state for each memristor includes determining the associated state for each memristor in a first subset of memristors in the plurality of memristors based at least in part on the first sub-formula; determining the associated state for each memristor in a second subset of memristors in the plurality of memristors based at least in part on the second sub-formula; determining the associated state for each memristor in a first column path of memristors in the plurality of memristors and each memristor in a first row path of memristors in the plurality of memristors, wherein the first column path and the first row path provide a first input to both the first subset and the second subset; determining the associated state for each memristor in a second row path of memristors in the plurality of memristors and each memristor in a second column path of memristors in the plurality of memristors, wherein the second row path and the second column path provide a logical OR combination of a first output from the first subset and a second output from the second subset; and determining the no-flow state for a third subset of memristors in the plurality of memristors and a fourth memristors in the plurality of memristors.

In another exemplary embodiment of any one of the computer readable media above, the computer readable medium is a non-transitory computer readable medium (e.g., CD-ROM, RAM, flash memory, etc.).

In a further exemplary embodiment of any one of the computer readable media above, the computer readable medium is a storage medium.

Various operations described are purely exemplary and imply no particular order. Further, the operations can be used in any sequence when appropriate and can be partially used. With the above embodiments in mind, it should be understood that additional embodiments can employ various computer-implemented operations involving data transferred or stored in computer systems. These operations are those requiring physical manipulation of physical quantities. Usually, though not necessarily, these quantities take the form of electrical, magnetic, or optical signals capable of being stored, transferred, combined, compared, and otherwise manipulated.

Any of the operations described that form part of the presently disclosed embodiments may be useful machine operations. Various embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines employing one or more processors coupled to one or more computer readable medium, described below, can be used with computer programs written in accordance with the teachings herein, or it may be more convenient to construct a more specialized apparatus to perform the required operations.

The procedures, processes, and/or modules described herein may be implemented in hardware, software, embodied as a computer-readable medium having program instructions, firmware, or a combination thereof. For example, the functions described herein may be performed by a processor executing program instructions out of a memory or other storage device.

The foregoing description has been directed to particular embodiments. However, other variations and modifications may be made to the described embodiments, with the attainment of some or all of their advantages. It will be further appreciated by those of ordinary skill in the art that modifications to the above-described systems and methods may be made without departing from the concepts disclosed herein. Accordingly, the invention should not be viewed as limited by the disclosed embodiments. Furthermore, various features of the described embodiments may be used without the corresponding use of other features. Thus, this description should be read as merely illustrative of various principles, and not in limitation of the invention.

What is claimed is:

1. A circuit comprising:
   a crossbar lattice having an input nanowire, an output nanowire and a plurality of memristors,
   wherein each memristor in the plurality of memristors is assigned one of: a flow state and a no-flow state in accordance with a Boolean formula such that the circuit provides at least one sneak path allowing current to flow between the input nanowire and the output nanowire when the Boolean formula is logically true.

2. The circuit of claim 1, wherein the crossbar lattice comprises:
   a plurality of row nanowires, the plurality of row nanowires arranged in rows and the plurality of row nanowires including the input nanowire and the output nanowire; and
   a plurality of column nanowires, the plurality of column nanowires arranged in columns; and
   wherein each memristor in the plurality of memristors connects a unique pair of nanowires, the unique pair including an associated row nanowire and an associated column nanowire, and
   a memristor is configured to allow the current to flow through the memristors between the associated row nanowire and the associated column nanowire when in the flow state and configured to prevent the current from flowing through the memristors between the associated row nanowire and the associated column nanowire when in the no-flow state.

3. The circuit of claim 2, wherein the plurality of row nanowires are arranged in parallel rows and the plurality of column nanowires are arranged in parallel columns, the parallel rows being perpendicular to the parallel columns.

4. The circuit of claim 2, wherein the input nanowire is a first row nanowire in the plurality of row nanowires which is located in a first end position and the output nanowire is a second row nanowire which is located in a second end position opposite the first end position.

5. The circuit of claim 1, wherein a sneak path comprises interconnected nanowires through which the current flows in crossbars.

6. The circuit of claim 1, wherein the circuit is configured to receive a voltage only at the input nanowire.

7. The circuit of claim 1, wherein the output nanowire is connected to ground via a resistor.

8. A method for evaluation of a Boolean formula using a memristor-based crossbar circuit, the method comprising:
   receiving an input Boolean formula; and
   for each memristor in a plurality of memristors of a memristor-based crossbar circuit, determining an associated state for the memristor based at least in part on the input Boolean formula such that the memristor-based crossbar circuit provides at least one sneak path allowing current to flow between an input nanowire and an output nanowire when the Boolean formula is logically true, and the associated state is one of: a flow state and a no-flow state.

9. The method of claim 8, wherein the memristor-based crossbar circuit comprises a crossbar lattice having an input nanowire, an output nanowire and a plurality of memristors,
   the memristor-based crossbar circuit includes a plurality of row nanowires, the plurality of row nanowires arranged in rows, a plurality of column nanowires, the plurality of column nanowires arranged in columns, and the plurality of memristors, each memristor connecting a unique pair of nanowires, the unique pair including an associated row nanowire and an associated column nanowire, a memristor is configured to allow the current to flow through the memristors between the associated row nanowire and the associated column nanowire when in a flow state and configured to prevent the current from flowing through the memristors between the associated row nanowire and the associated column nanowire when in a no-flow state.

10. The method of claim 8, further comprising:
    setting each memristor in the memristor-based crossbar circuit to the associated states;
    providing a voltage to the input nanowire;
    measuring a voltage difference across a resistor connected to the output nanowire; and
    assigning a result to the Boolean formula based on the voltage difference.

11. The method of claim 10, wherein assigning the result comprises:
    in response to the voltage difference being relatively high, assigning a value of true to the result; and
    in response to the voltage difference being relatively low, assigning a value of false to the result.

12. The method of claim 11, further comprising:
    determining the measured voltage difference to be relatively high when the measured voltage difference exceeds a first threshold value; and
    determining the measured voltage difference to be relatively low when the measured voltage difference is below a second threshold value.

13. The method of claim 8, wherein the input Boolean formula is a combination of a first sub-formula and a second sub-formula,
    the first sub-formula and the second sub-formula create the input Boolean formula when combined using a Boolean operation, and
    the Boolean operation is one of: a disjunction operation and a conjunction operation.

14. The method of claim 13, wherein the Boolean operation is the conjunction operation and determining the associated state for each memristor comprises:
    determining the associated state for each memristor in a first subset of memristors in the plurality of memristors based at least in part on the first sub-formula;
    determining the associated state for each memristor in a second subset of memristors in the plurality of memristors based at least in part on the second sub-formula, wherein an output row of the first subset is an input row of the second subset; and
    determining the no-flow state for a third subset of memristors in the plurality of memristors and a fourth memristors in the plurality of memristors.

15. The method of claim 13, wherein the Boolean operation is the disjunction operation and determining the associated state for each memristor comprises:
    determining the associated state for each memristor in a first subset of memristors in the plurality of memristors based at least in part on the first sub-formula;
    determining the associated state for each memristor in a second subset of memristors in the plurality of memristors based at least in part on the second sub-formula;
    determining the associated state for each memristor in a first column path of memristors in the plurality of memristors and each memristor in a first row path of memristors in the plurality of memristors, wherein the first column path and the first row path provide a first input to both the first subset and the second subset;
    determining the associated state for each memristor in a second row path of memristors in the plurality of memristors and each memristor in a second column path of memristors in the plurality of memristors, wherein the second row path and the second column path provide a logical OR combination of a first output from the first subset and a second output from the second subset; and
    determining the no-flow state for a third subset of memristors in the plurality of memristors and a fourth memristors in the plurality of memristors.

16. The method of claim 8, wherein the current flows between the input nanowire and the output nanowire only when the Boolean formula is logically true.

17. The method of claim 8, wherein the Boolean formula is in negation normal form.

18. A non-transitory computer readable medium tangibly encoded with a computer program executable by a processor to perform actions comprising:
    receiving an input Boolean formula; and
    for each memristor in a plurality of memristors of a memristor-based crossbar circuit, determining an associated state for the memristor based at least in part on the input Boolean formula such that the memristor-based crossbar circuit provides at least one sneak path allowing current to flow between an input nanowire and an output nanowire when the Boolean formula is logically true, and the associated state is one of: a flow state and a no-flow state.

19. The non-transitory computer readable medium of claim 18, wherein the input Boolean formula is a combination of a first sub-formula and a second sub-formula, the first sub-formula and the second sub-formula create the input Boolean formula when combined using a Boolean conjunction operation, and determining the associated state for each memristor comprises:
    determining the associated state for each memristor in a first subset of memristors in the plurality of memristors based at least in part on the first sub-formula;

determining the associated state for each memristor in a second subset of memristors in the plurality of memristors based at least in part on the second sub-formula, wherein an output row of the first subset is an input row of the second subset; and determining the no-flow state for a third subset of memristors in the plurality of memristors and a fourth memristors in the plurality of memristors.

20. The non-transitory computer readable medium of claim 18, wherein the input Boolean formula is a combination of a first sub-formula and a second sub-formula, the first sub-formula and the second sub-formula create the input Boolean formula when combined using a Boolean disjunction operation, and determining the associated state for each memristor comprises:

determining the associated state for each memristor in a first subset of memristors in the plurality of memristors based at least in part on the first sub-formula;

determining the associated state for each memristor in a second subset of memristors in the plurality of memristors based at least in part on the second sub-formula;

determining the associated state for each memristor in a first column path of memristors in the plurality of memristors and each memristor in a first row path of memristors in the plurality of memristors, wherein the first column path and the first row path provide a first input to both the first subset and the second subset;

determining the associated state for each memristor in a second row path of memristors in the plurality of memristors and each memristor in a second column path of memristors in the plurality of memristors, wherein the second row path and the second column path provide a logical OR combination of a first output from the first subset and a second output from the second subset; and determining the no-flow state for a third subset of memristors in the plurality of memristors and a fourth memristors in the plurality of memristors.

* * * * *